(12) United States Patent  
Van Dijke et al.

(10) Patent No.: US 9,927,848 B2  
(45) Date of Patent: Mar. 27, 2018

(54) HOUSING USED IN MONITOR OF INDUSTRIAL COMPUTER, MONITOR USED IN INDUSTRIAL COMPUTER, AND INDUSTRIAL COMPUTER

(71) Applicant: OMRON Corporation, Kyoto (JP)

(72) Inventors: Casper Van Dijke, Orthenseweg (NL); Jeremy Wirkus, Texelstraat (NL); Nard Louws, Gilze (NL)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 15/410,780

(22) Filed: Jan. 20, 2017

(65) Prior Publication Data

US 2017/0255237 A1    Sep. 7, 2017

(30) Foreign Application Priority Data

Mar. 4, 2016   (DE) .......................... 20 2016 101 176

(51) Int. Cl.
*G06F 1/16*    (2006.01)
*G06F 1/18*    (2006.01)

(52) U.S. Cl.
CPC ............ *G06F 1/182* (2013.01); *G06F 1/1601* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,661,630 A * | 8/1997 | Levins | ................... | G06F 1/1601 312/7.2 |
| 5,973,916 A * | 10/1999 | Han | ....................... | G06F 1/1601 348/836 |
| 6,002,582 A * | 12/1999 | Yeager | .............. | G02F 1/133308 248/917 |
| 6,189,850 B1 * | 2/2001 | Liao | ...................... | F16M 11/105 248/292.14 |
| 6,570,627 B1 * | 5/2003 | Chang | ..................... | F16M 11/10 248/917 |
| 6,639,788 B1 * | 10/2003 | Liao | ...................... | F16M 11/105 248/292.14 |
| 7,232,098 B2 * | 6/2007 | Rawlings | ............. | F16M 11/041 248/121 |

(Continued)

FOREIGN PATENT DOCUMENTS

DE         202009015850         2/2010

*Primary Examiner* — Lisa Lea Edmonds
(74) *Attorney, Agent, or Firm* — JCIPRNET

(57) ABSTRACT

A housing for a monitor of an industrial computer is installed in/on a plate and includes a basic section, a frame section, an engagement element, a spring element, a guide element and a fixing element. The frame section is attached on the plate. The engagement element optionally moves from an unlocked position where the engagement element is detached from engagement with the plate to a locked position where the engagement element is engaged with the plate in a shape fitting manner. The spring element pretensions the engagement element in a direction toward the locked position. The engagement element is linearly guided along the guide element. The fixing element fixes the engagement element at the unlocked position or the locked position, and is releasable, so that the engagement element automatically moves from the unlocked position to the locked position by means of the spring element.

15 Claims, 11 Drawing Sheets

(56) References Cited

U.S. PATENT DOCUMENTS

| | | | | |
|---|---|---|---|---|
| 7,499,272 B2* | 3/2009 | Searby | ............... | F16M 11/041 |
| | | | | 248/917 |
| 7,502,226 B2* | 3/2009 | Searby | ............... | F16M 11/041 |
| | | | | 361/679.41 |
| 7,752,789 B2* | 7/2010 | Sun | ................. | G06F 1/1601 |
| | | | | 108/70 |
| 8,125,771 B2* | 2/2012 | Yukawa | ............ | G06F 1/16 |
| | | | | 313/582 |
| 8,289,683 B2* | 10/2012 | Wang | ............... | G06F 1/181 |
| | | | | 361/679.02 |
| 8,456,862 B2* | 6/2013 | Lee | ................. | F16M 11/10 |
| | | | | 361/679.01 |
| 8,605,434 B2* | 12/2013 | Chao | ............... | G06F 1/182 |
| | | | | 361/690 |
| 8,733,716 B2* | 5/2014 | Li | ................... | F16M 11/041 |
| | | | | 248/188 |
| 8,925,878 B2* | 1/2015 | Hsu | ................. | A47B 23/043 |
| | | | | 248/122.1 |
| 2004/0232298 A1* | 11/2004 | Bremmon | ........ | F16M 11/10 |
| | | | | 248/281.11 |
| 2006/0250540 A1* | 11/2006 | Wellhofer | ...... | H04N 5/64 |
| | | | | 349/58 |
| 2006/0268496 A1* | 11/2006 | Wang | ............... | F16M 11/10 |
| | | | | 361/679.21 |
| 2015/0257299 A1* | 9/2015 | Su | ..................... | A47B 97/00 |
| | | | | 361/679.01 |
| 2016/0113130 A1* | 4/2016 | Le | .................... | G02F 1/0105 |
| | | | | 361/679.01 |
| 2016/0161045 A1* | 6/2016 | Lee | ................... | F16M 11/10 |
| | | | | 361/679.22 |
| 2016/0270270 A1* | 9/2016 | Madsen | ............ | H04B 1/08 |

* cited by examiner

HOUSING USED IN MONITOR OF INDUSTRIAL COMPUTER, MONITOR USED IN INDUSTRIAL COMPUTER, AND INDUSTRIAL COMPUTER

CROSS-REFERENCE TO RELATED APPLICATION

This application claims the priority benefit of German application serial no. DE202016101176.0, filed on Mar. 4, 2016. The entirety of the above-mentioned patent application is hereby incorporated by reference herein and made a part of this specification.

BACKGROUND OF THE DISCLOSURE

1. Field of the Disclosure

The disclosure relates to a housing used in a monitor of an industrial computer, a monitor that has the housing and that is used in an industrial computer, and an industrial computer that has the housing and/or the monitor.

2. Description of Related Art

An industrial computer or an IPC in short refers to a computer used for tasks in an industrial field. This industrial computer has a hard housing, which is, in particular, configured to protect the industrial computer from being affected by external factors (for example, dust, electromagnetic interference and/or moisture). Such industrial computers are generally applied to process visualization, robot technologies, industrial automation, test and test stand working modes, or the like. Such industrial computers must be strong and stable with respect to devices in an office area and do not easily break down. An industrial computer may have a monitor, and a housing of the monitor may be fixed to a flat plate, for example, a machine cladding.

DE 20 2009 015 850 U1 describes a housing. At an initial position, a clamped piece is fixed to a housing in a housing profile defined by a periphery. A tangential guide apparatus is provided in the housing to move the clamped piece, from the initial position across the housing profile along a fixed direction outwards to a fixed position, and a clamping means is provided in the housing to clamp the clamped piece from the fixed position along a clamping direction towards a flange to a clamped position.

SUMMARY OF THE DISCLOSURE

In this background, the disclosure provides an improved housing used in a monitor of an industrial computer.

Therefore, the disclosure provides a housing used in a monitor of an industrial computer. The housing includes a basic section, on which the housing is installed in a plate or on the plate, where the basic section is adapted to be accommodated in a notch of the plate; a frame section connected to the basic section, where the frame section is adapted to be attached on the plate; at least one engagement element, adapted to optionally move from an unlocked position where the at least one engagement element is detached from engagement with the plate to a locked position where the at least one engagement element is engaged with the plate in a shape fitting manner; a spring element, which pretensions the at least one engagement element in a direction toward the locked position; a guide element, where the at least one engagement element is linearly guided along the guide element; and a fixing element, configured to fix the at least one engagement element at the unlocked position or the locked position, where the fixing element is releasable, so that the at least one engagement element automatically moves from the unlocked position to the locked position by means of the spring element.

A connection of shape fitting is generated by means of mutual engagement between at least two connection objects (the at least one engagement element and the plate herein). In this way, the connected objects do not separate from each other in a case in which force transmission does not exist or force transmission is interrupted. In other words, in a case in which there is a connection of shape fitting, one connection object hinders another connection object. Therefore, the connection between the at least one engagement element and the plate can be removed only by moving the at least one engagement element from the locked position to the unlocked position.

The housing may also be called a monitor housing. The basic section is preferably constructed by using materials consistent with those of the frame section. Specifically, the basic section and the frame section may be formed a plastic injection molding together. The plate may be a part of, for example, a furniture, a cabinet, a machine cladding, a switch box, or the like. The plate is preferably planar. The plate may also be called a panel or a metal plate.

The at least one engagement element is pre-tensioned by the spring towards the direction of the locked position. In this way, the at least one engagement element can be moved from the unlocked position to the locked position by simply loosening the fixing element. In this way, the housing can be fixed to the plate quickly and conveniently. When the fixing element is released, preferably, the fixing element is not removed from the engagement element. In this way, the fixing element can be prevented from being lost. The guide element and the fixing element, in particular, are two components that separate from each other. In this way, a simple structure of the housing can be implemented. The at least one engagement element is linearly guided, so as to generate simple movement performance compared with the known housing. This improves usability. In addition, an additional component configured to fix the housing to the plate does not need to be provided in the housing described in the present text.

According to an implementation manner, the at least one engagement element is adapted to move from the unlocked position to the locked position in a manner of being parallel to a back surface of the frame section.

The back surface of the frame section preferably forms a plane, and the at least one engagement element may move from the unlocked position to the locked position a manner of being parallel to the plane, and vice versa. In this case, a back surface of the engagement element forms another plane, which is arranged in a manner of being parallel to the plane formed by the back surface of the frame section.

According to another implementation manner, the at least one engagement element is accommodated in a first recess provided on the basic section, and the spring element is accommodated in a second recess provided on the basic section.

Preferably, the first recess is arranged adjacent to the second recess. A wall portion is provided between the first recess and the second recess, and has a gap. The gap connects the two recesses. The basic section preferably has four side walls, which form a rectangular geometric structure. Specifically, the at least one engagement element is provided in one of the side walls. Specifically, each side wall may also be allocated with multiple engagement elements of this type.

According to another implementation manner, the first recess is provided with a first drilling hole configured to accommodate the guide element and a second drilling hole configured to accommodate the fixing element.

The guide element may be a screw screwed into the first drilling hole or a pin pressed into the first drilling hole. The second drilling hole preferably includes a thread configured to screw the fixing element and unscrew the fixing element.

According to another implementation mariner, a guide slot configured to guide the fixing element is provided on the second drilling hole.

By unscrewing the fixing element from the second drilling hole, the fixing element is accommodated in the guide slot and is guided in the guide slot.

According to another implementation manner, the spring element includes two legs, and one of the legs is connected to the at least one engagement element.

The spring element preferably has a spiral shape basic portion plug-connected in the pin provided in the second recess, and a first leg and a second leg. The first leg is preferably accommodated in a drilling hole of the at least one engagement element. The second leg is supported on the basic section, and in particular, on the second recess. The first leg passes through the gap between the first recess and the second recess.

According to another implementation manner, the at least one engagement element includes protrusions, and the protrusions are adapted to limit a movement path of the at least one engagement element in the direction toward the locked position.

Preferably, a position limiting surface is provided on the basic section, and in particular, on a corresponding side wall. The protrusions abut against the position limiting surfaces. By means of the protrusions, the at least one engagement element can be prevented from being completely extracted from the housing when the guide element is removed. In this way, the at least one engagement element can be prevented from being lost.

According to another implementation manner, the at least one engagement element is adapted to move from the locked position to the unlocked position in a direction reverse to an elastic force of the spring element.

To move the at least one engagement element from the locked position to the unlocked position, the at least one engagement element is pushed back into the housing in a direction reverse to the elastic force of the spring element and is fixed at the unlocked position by means of the fixing element.

According to another implementation manner, the guide element is connected to the basic section, and the guide element is guided in a guide slot provided on the at least one engagement element.

The guide element may be screwed into the basic section or pressed into the basic section. Therefore, the first drilling hole is provided on the first recess. The guide slot provided on the at least one engagement element may be an elongated hole, and the guide element passes through the elongated hole.

According to another implementation manner, the fixing element is releasable by means of rotation thereof.

In this way, the fixing element can be simply released by means of a tool, for example, a screw driver.

According to another implementation manner, the fixing element is a threaded pin.

The fixing element, for example, may be the so-called headless screw. In this way, the fixing element can be manufactured at low costs.

According to another implementation manner, the at least one engagement element is adapted to be engaged in a slot provided on the plate at the locked position in a shape fitting manner.

The slot is optional. Each engagement element is preferably allocated with the slot.

According to another implementation manner, a quantity of the at least one engagement element is plural, and the engagement elements are provided on side walls of the basic section.

Specifically, at least two engagement elements are provided. For example, four, eight, or multiple engagement elements may be provided. Each side wall may be allocated with at least one or more engagement elements.

The disclosure further provides a monitor that has the housing and is used in an industrial computer.

The monitor preferably has a display accommodated in the housing, for example, an LCD display or an LED display.

The disclosure further provides an industrial computer that has the housing and/or the monitor.

The industrial computer may have a housing apparatus, which can be connected to the housing of the monitor in a releasable manner. The industrial computer may further include one or more storage media and a circuit board, for example, a main board or a motherboard.

In the features or implementation manners described above or below by means of embodiments, some combinations are not explicitly pointed out in the present text, and other practicable implementation solutions of the housing, the monitor, and/or the industrial computer are also included therein. Improved or supplementary solutions provided, in a form of independent aspects, by a person skilled in the art with respect to basic forms of the housing, the monitor, and/or the industrial computer also belong to the other practicable implementation solutions of the disclosure.

Refer to dependent claims and embodiments described below of the housing, the monitor, and/or the industrial computer for more advantageous design solutions and aspects of the housing, the monitor, and/or the industrial computer. The housing, the monitor, and/or the industrial computer are described in detail below with reference to exemplary implementation manners shown in the accompanying drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
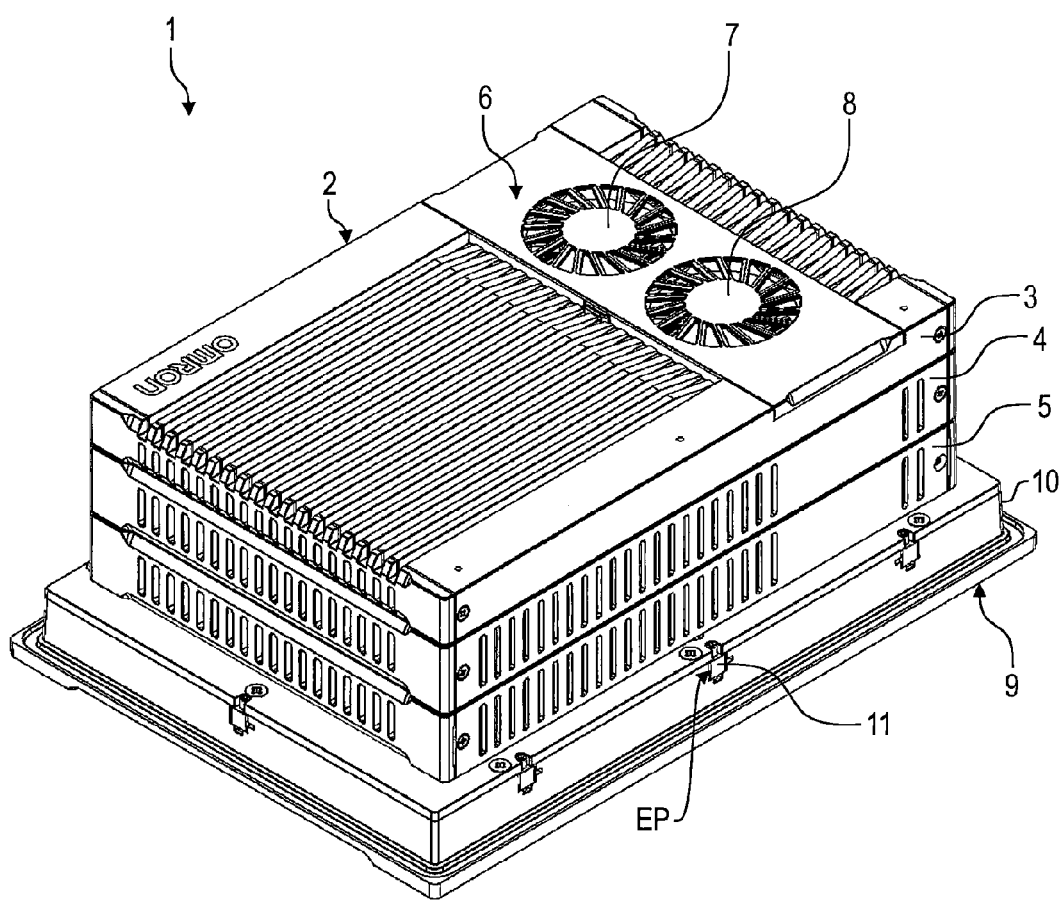
FIG. 1 is a schematic perspective diagram of an implementation manner of an industrial computer.

Reference will now be made in detail to the present preferred embodiments of the disclosure, examples of which are illustrated in the accompanying drawings. Wherever possible, the same reference numbers are used in the drawings and the description to refer to the same or like parts.

Unless otherwise specified, same elements or elements with same functions in the accompanying drawings are represented by a same reference sign.

Figure 2:
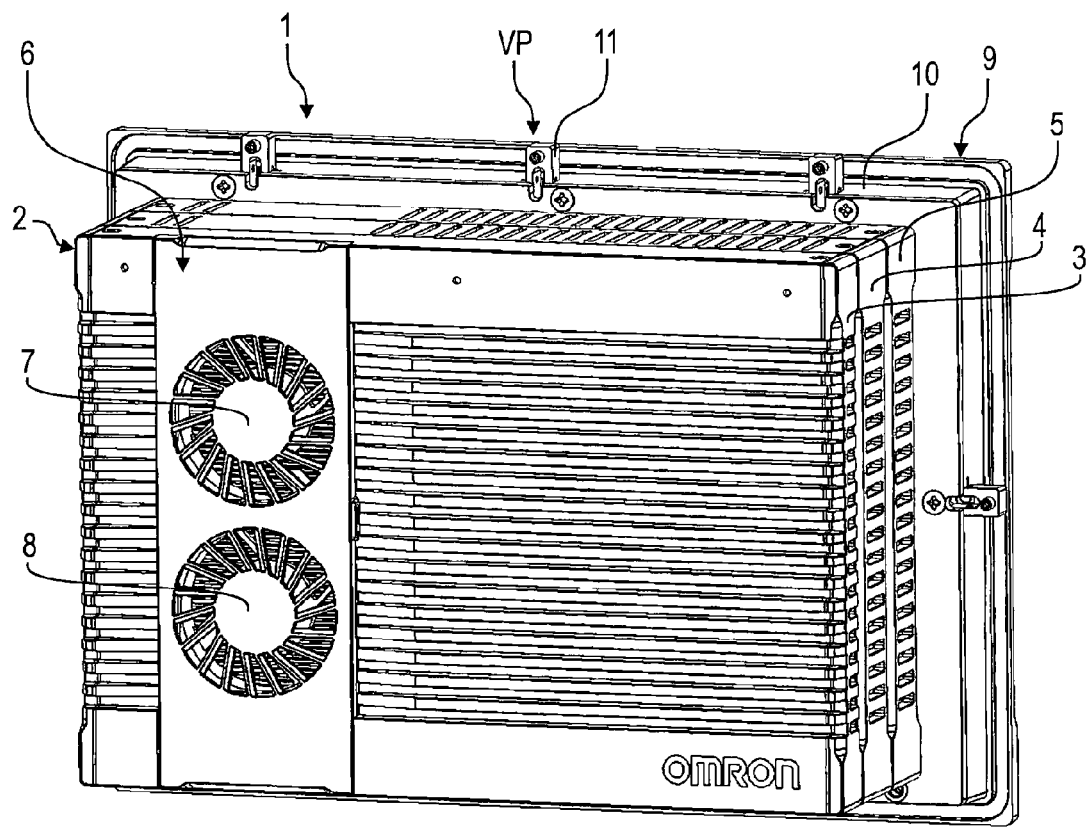
FIG. 2 is another schematic perspective diagram of the industrial computer shown in FIG. 1.

FIG. 1 and FIG. 2 are both schematic perspective diagrams of an implementation manner of an industrial computer 1. The industrial computer 1, an industrial computer, an IPC or Industrierechner in short refers to a computer preferably used for tasks in an industrial field, and in particular, to a computer similar to an IBM compatible PC, and in particular, a computer that can work by using software with respect to such devices. A common application range of the industrial computer 1 is process visualization, robot technologies, industrial automation, test and test stand working modes, security technologies, or quality guarantee. The industrial computer 1 must satisfy a special requirement with respect to devices in an office area, is generally not affected by environmental factors or electromagnetic interference, and does not easily break down on the whole.

The industrial computer 1 includes a modular housing apparatus 2. The modular housing apparatus 2 refers to an apparatus formed by modular construction of multiple units. The units, in particular, separate from each other and are connected together without tool. The housing apparatus 2 includes a square cooling housing 3, a square electronic device accommodation housing 4, and at least one square accessory accommodation housing 5 herein. The housing apparatus 2 may have multiple accessory accommodation housings 5 and/or multiple electronic device accommodation housings 4. In orientation of FIG. 1, the electronic device accommodation housing 4 is arranged on the accessory accommodation housing 5; the cooling housing 3 is arranged on the electronic device accommodation housing 4; therefore, the electronic device accommodation housing 4 is arranged between the cooling housing 3 and the accessory accommodation housing 5.

The electronic device accommodation housing 4 is suitable to accommodate electronic components, for example, a main board, a motherboard, a processor, a CPU, or other electronic components of the industrial computer 1. The cooling housing 3 is suitable to cool the electronic components accommodated in the electronic device accommodation housing 4. The accessory accommodation housing 5 is suitable to accommodate additional components of the industrial computer 1, for example, a disk drive, a hard disk, a power supply, and/or an additional circuit board that can be connected to a main board. The cooling housing 3, the electronic device accommodation housing 4, and/or the accessory accommodation housing 5 may be made of plastics. The cooling housing 3 includes a cooling unit 6 that can be inserted in the cooling housing 3 and can be extracted from the cooling housing 3. The cooling unit 6 includes multiple fans 7 and 8. Quantities of the fans 7 and 8 are arbitrary. For example, two fans 7 and two fans 8 may be provided.

The industrial computer 1 further includes a monitor 9, which has a housing 10, in particular, a monitor housing; the housing is connected to the housing apparatus 2, and in particular, to the accessory accommodation housing 5. The housing 10 includes at least one, preferably, a plurality of engagement elements 11. In FIG. 1 and FIG. 2, only one of the engagement elements has a reference sign. The housing 10, for example, may have eight such engagement elements 11. The engagement element 11 can optionally move from an unlocked position EP shown in FIG. 1 where the engagement element 11 is embedded in the housing 10 to a locked position VP shown in FIG. 2 where the engagement element 11 extends out of the housing 10.

Figure 3:
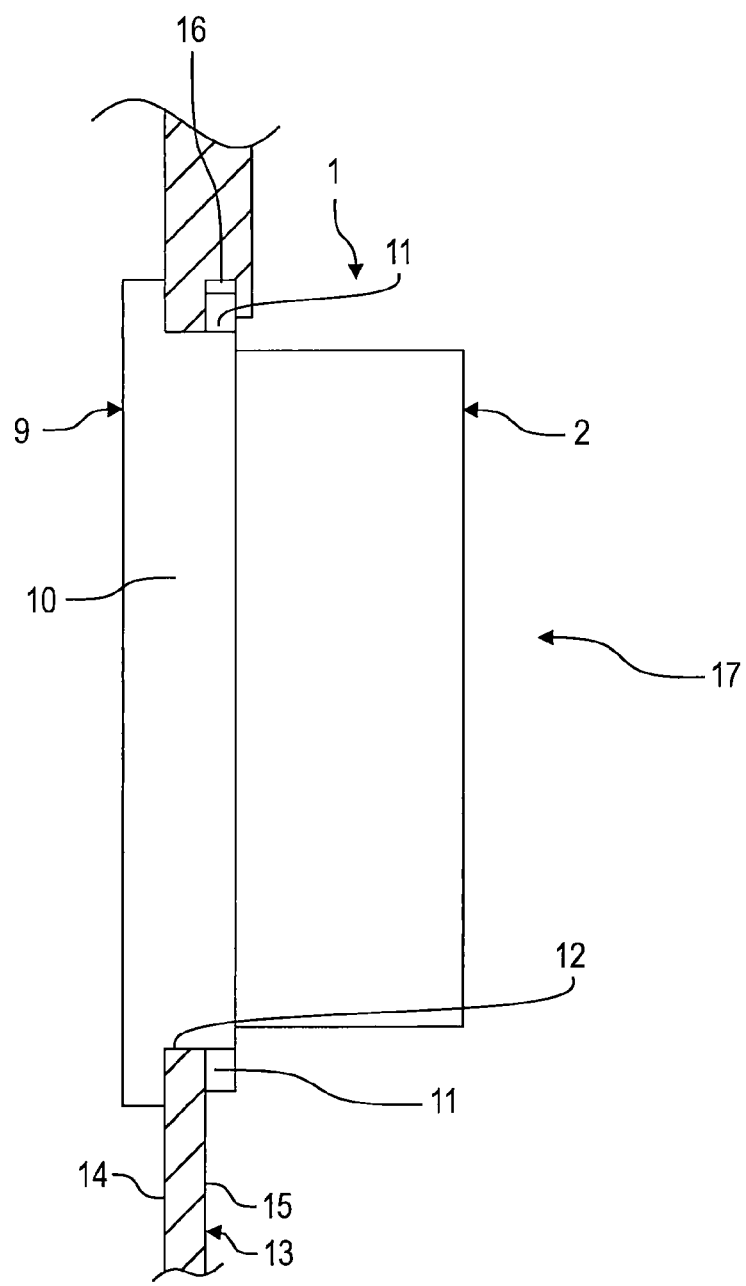
FIG. 3 is a schematic cross-sectional view of the industrial computer shown in FIG. 1.

FIG. 3 is a prominently simplified schematic cross-sectional view of the industrial computer shown in FIG. 1 and FIG. 2. The housing 10 of the monitor 9 may be installed in a recess portion or a notch 12 of a plate 13 or thereon. The plate 13 may be a part of, for example, a furniture, a building, a machine cladding, a switch box, a device housing, or the like, to accommodate the industrial computer 1. The plate 13, for example, may be a planar steel plate. The plate 13 has a front surface 14 and a back surface 15. The notch 12 may be a through hole provided in the plate 13. To install the housing 10 on the plate 13, the engagement element 11 can move from the unlocked position EP shown in FIG. 1 where the engagement element 11 is detached from engagement with the plate 13 to the locked position VP shown in FIG. 2 where the engagement element 11 is engaged with the plate 13 in a shape fitting manner.

Specifically, the engagement element 11 is engaged behind the plate 13 by means of a shape fitting manner. A connection of shape fitting is generated by means of mutual engagement between at least two connection objects (the engagement element 11 and the plate 13 herein). In this way, the connected objects do not separate from each other in a case in which force transmission does not exist or force transmission is interrupted. In other words, in a case in which there is a connection of shape fitting, one connection object hinders another connection object. Therefore, the connection between housing 10 and the plate 13 can be removed only by moving the engagement element 11 from the locked position VP to the unlocked position EP.

As shown in an upper part of orientation of FIG. 3, a slot 16 may be provided on the plate 13, and each engagement element 11 is engaged in the slot in a shape fitting manner. The slot 16 is optional. As an alternative solution, as shown in a lower part of the orientation of FIG. 3, the engagement elements 11 may be engaged only behind the plate 13. An industrial computer apparatus 17 may have the plate 13 and in particular, an apparatus allocated to the plate 13 (for example, a cabinet), and the industrial computer 1.

Figure 4:
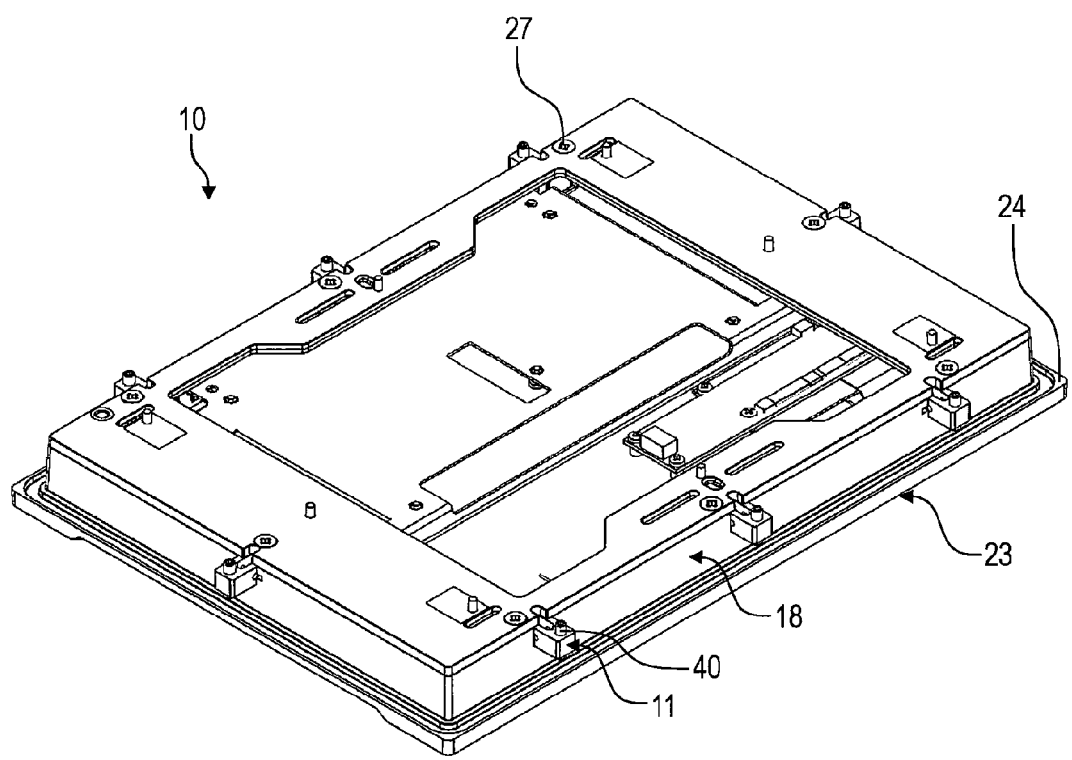
FIG. 4 is a schematic perspective diagram of an implementation manner of a housing used in a monitor of the industrial computer shown in FIG. 1.
Figure 5:
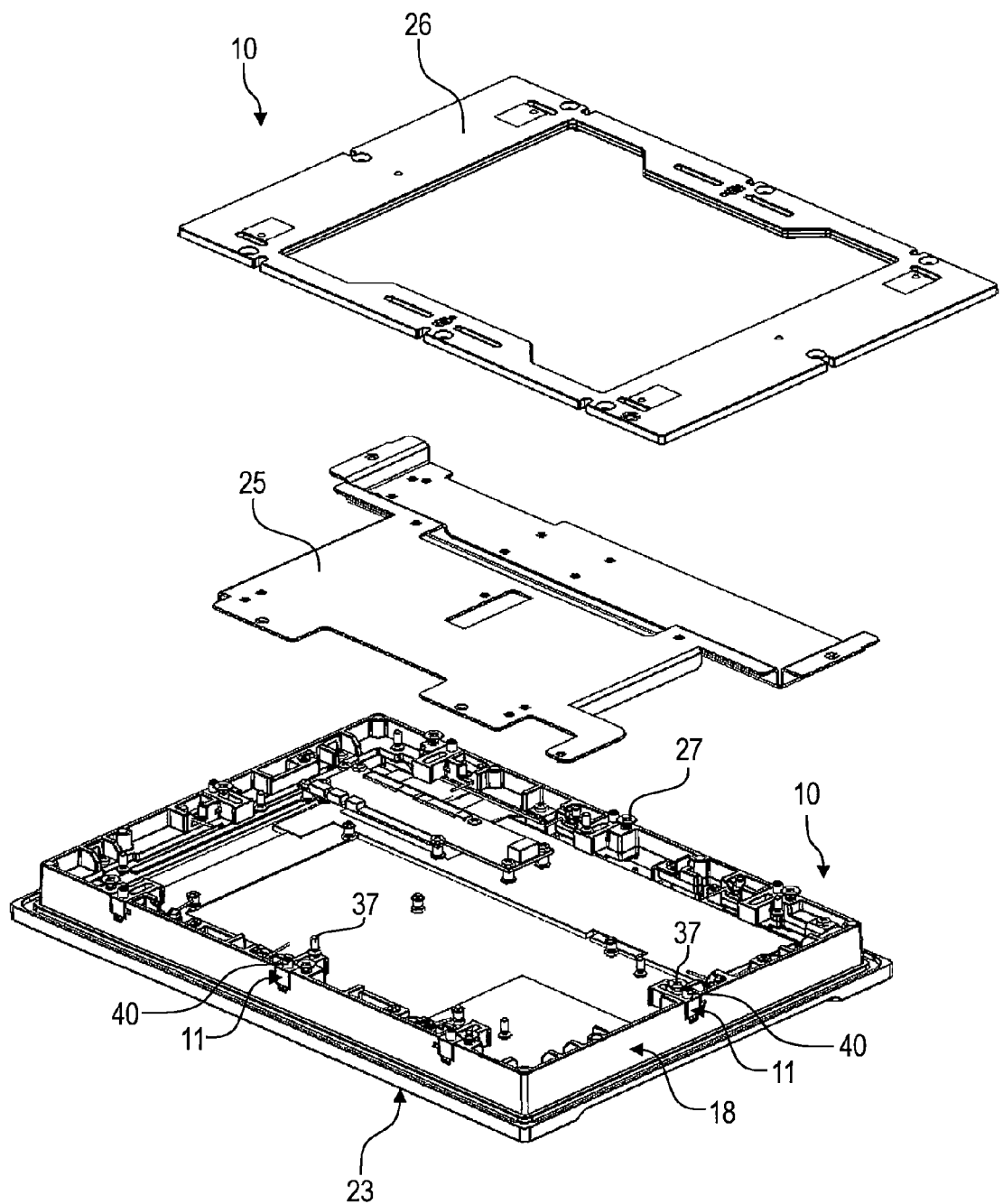
FIG. 5 is a schematic perspective exploded view of the housing shown in FIG. 4.
Figure 6:
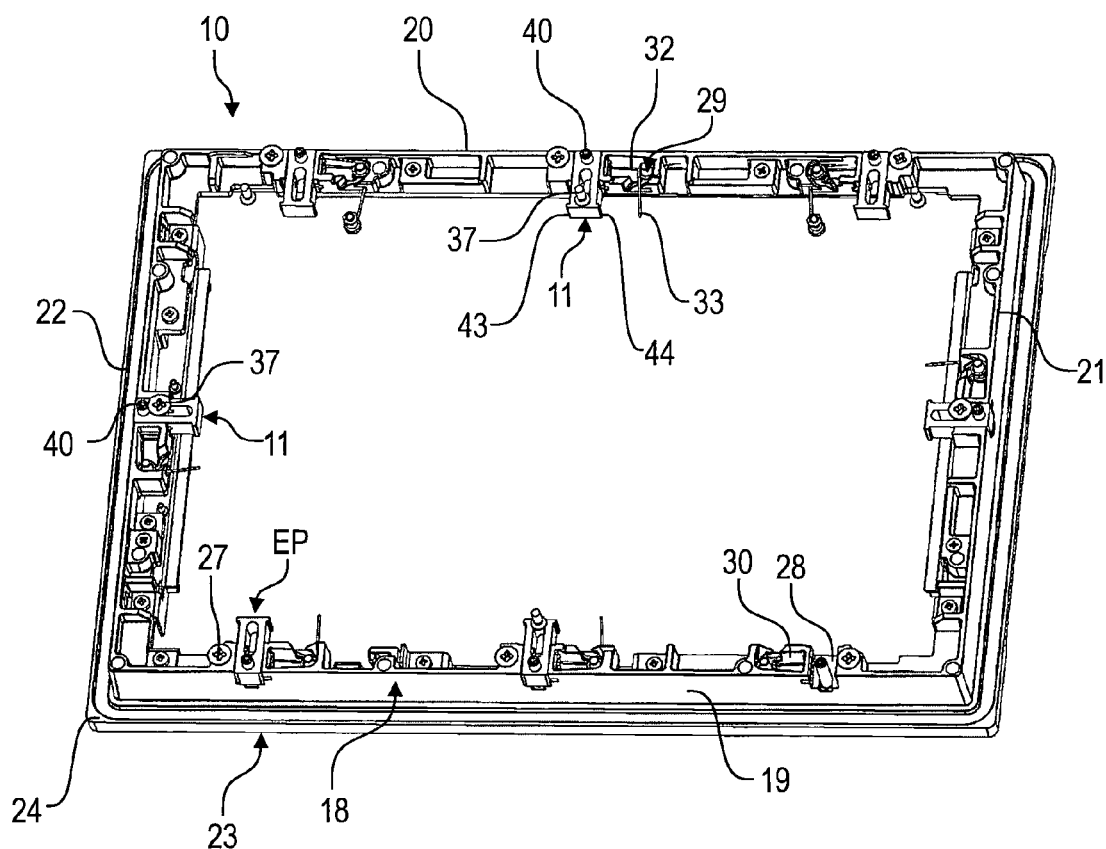
FIG. 6 is another schematic perspective diagram of the housing shown in FIG. 4.

FIG. 4 is a schematic perspective diagram of the housing of the monitor 9. FIG. 5 is a schematic perspective exploded view of the housing 10. FIG. 6 is another schematic perspective diagram of the housing 10. FIG. 4 to FIG. 6 are described below at the same time.

The housing 10 of the monitor 9 includes a basic section 18 for installing the housing 10. As shown in FIG. 3, the basic section may be accommodated in the notch 12 of the plate 13. The basic section 18 includes a first side wall 19, a second side wall 20 arranged opposite to the first side wall 19, a third side wall 21, and a fourth side wall 22 arranged opposite to the third side wall 21, where the third side wall 21 is arranged perpendicular to the first side wall 19 and the second side wall 20.

The housing 10 further includes a frame section 23 fixed to the basic section 18, and in particular, constructed by using materials consistent with those of the frame section 18. The frame section 23 includes a back surface 24, which is attached on the front surface 14 of the plate 13 and surrounds the notch 12. The basic section 18 and the frame section 23, for example, are implemented as a plastic injection molding. For example, three engagement elements 11 are individually provided on the first side wall 19 and the second side wall 20, and one engagement element 11 is individually provided on the third side wall 21 and the fourth side wall 22. Quantities of the engagement elements 11 on each of the side walls 19 to 22 are arbitrary.

FIG. 4 shows the engagement element 11 located at the locked position VP. FIG. 5 and FIG. 6 show the engagement element 11 located at the unlocked position EP. As shown in FIG. 5, the housing 10 includes a plate-like component 25 accommodated therein. The plate-like component, for example, supports an LCD display or an LED display. The housing 10 further includes a rear wall 26, which is fixedly connected (for example, screw joint) to the basic section 18 by means of a fixing element 27, for example, a threaded screw. A quantity of the fixing elements 27 may be equal to that of the engagement elements 11. The fixing element 27, for example, may be a threaded screw that has a countersunk embedded in the rear wall 26.

Figure 7:
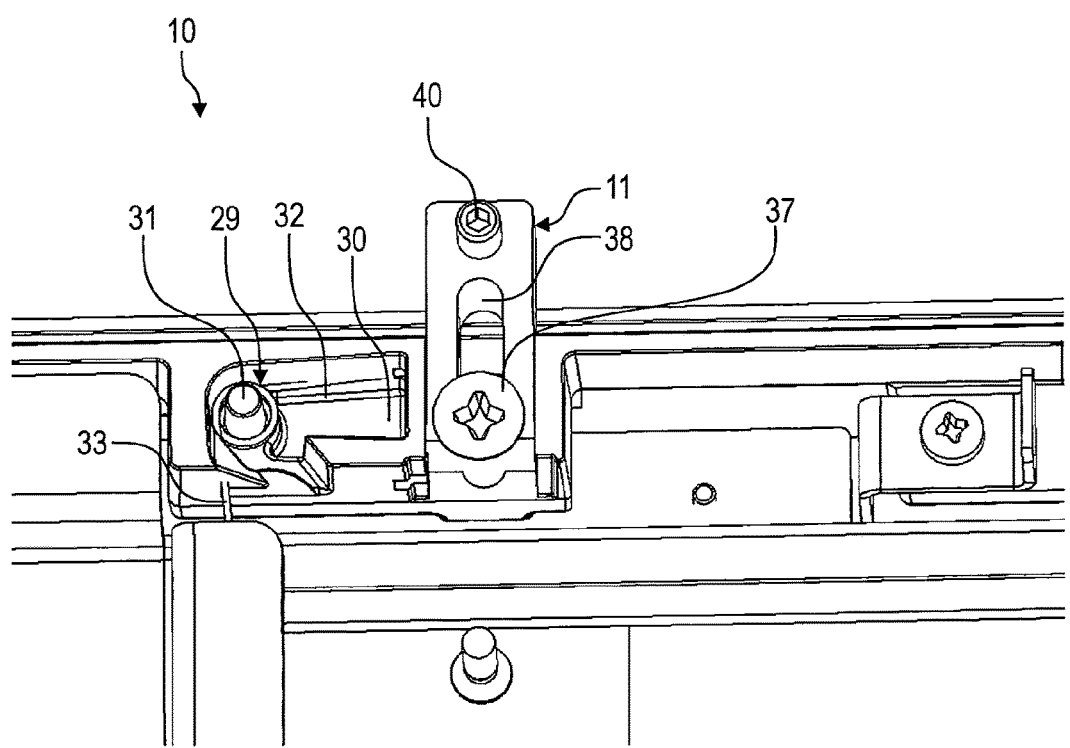
FIG. 7 is a schematic perspective enlarged diagram of the housing shown in FIG. 4.
Figure 8:
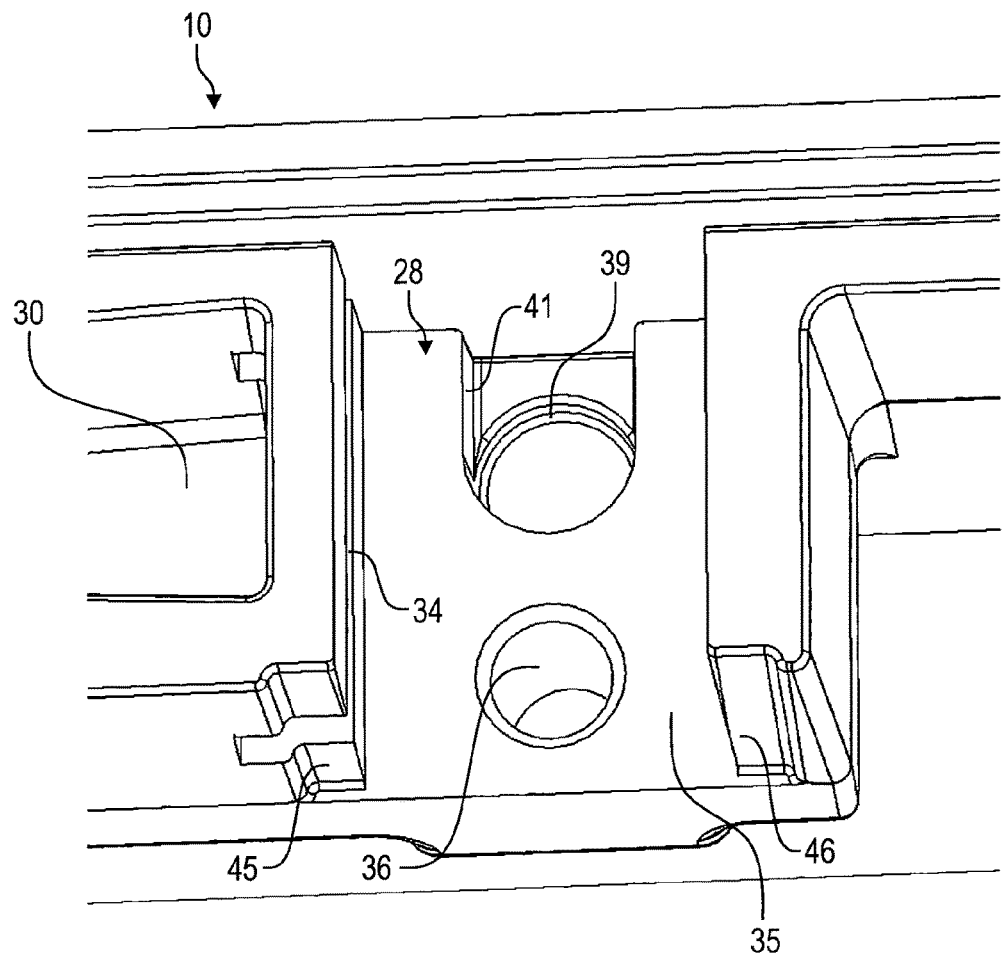
FIG. 8 is another schematic perspective enlarged diagram of the housing shown in FIG. 4.

FIG. 7 and FIG. 8 are both schematic perspective detailed diagrams of the housing 10. As shown in FIG. 7 and FIG. 8, the housing 10, and in particular, the side walls 19 to 22 individually include a first recess 28, and the engagement elements 11 are accommodated in the recesses. Each engagement element 11 is further allocated with a spring element 29, which is accommodated in a second recess 30 arranged adjacent to the first recess 28. The spring element 29 is plug-connected to a pin 31 arranged in the second recess 30. The spring element 29 includes a first leg 32 connected to the engagement element 11 allocated with the first leg and a second leg 33 supported on the basic section 18.

The first recess 28 is connected to the second recess 30 by means of a gap 34 passed through by the first leg 32. The first recess 28 includes a bottom portion 35, and the engagement element 11 allocated to the first recess 28 slides on the bottom portion. A first drilling hole 36 configured to accommodate a guide element 37 is provided on the bottom portion 35. As shown in FIG. 6 and FIG. 7, the guide element 37 may be a pin pressed into the first drilling hole 36 or a threaded screw screwed into the first drilling hole 36. At the same time, the guide element 37 may be configured to fix the rear wall 26 on the basic section 18. Each engagement element 11 includes, for example, a guide slot 38 in a shape of an elongated hole. The guide element 37 is guided in the guide slot 38. Therefore, each engagement element 11 is linearly guided in the first recess 28 allocated to the corresponding engagement element 11 by means of the guide slot 38 allocated to the engagement element and the guide element 37 allocated to the engagement element.

In addition to the first drilling hole 36, each first recess 28 further includes a second drilling hole 39 configured to accommodate a fixing element 40. The second drilling hole 39 may have an internal thread. The fixing element 40 preferably is a threaded pin that can be screwed into the second drilling hole 39 and can be unscrewed from the second drilling hole 39. That is, the corresponding fixing element 40 allocated to the engagement element 11 can be released by means of rotation thereof and performs fixation again. The engagement element 11 preferably has a threaded drilling hole applicable to the fixing element 40. As shown in FIG. 8, a guide slot 41 configured to guide the fixing element 40 is provided on the second drilling hole 39.

Figure 9:
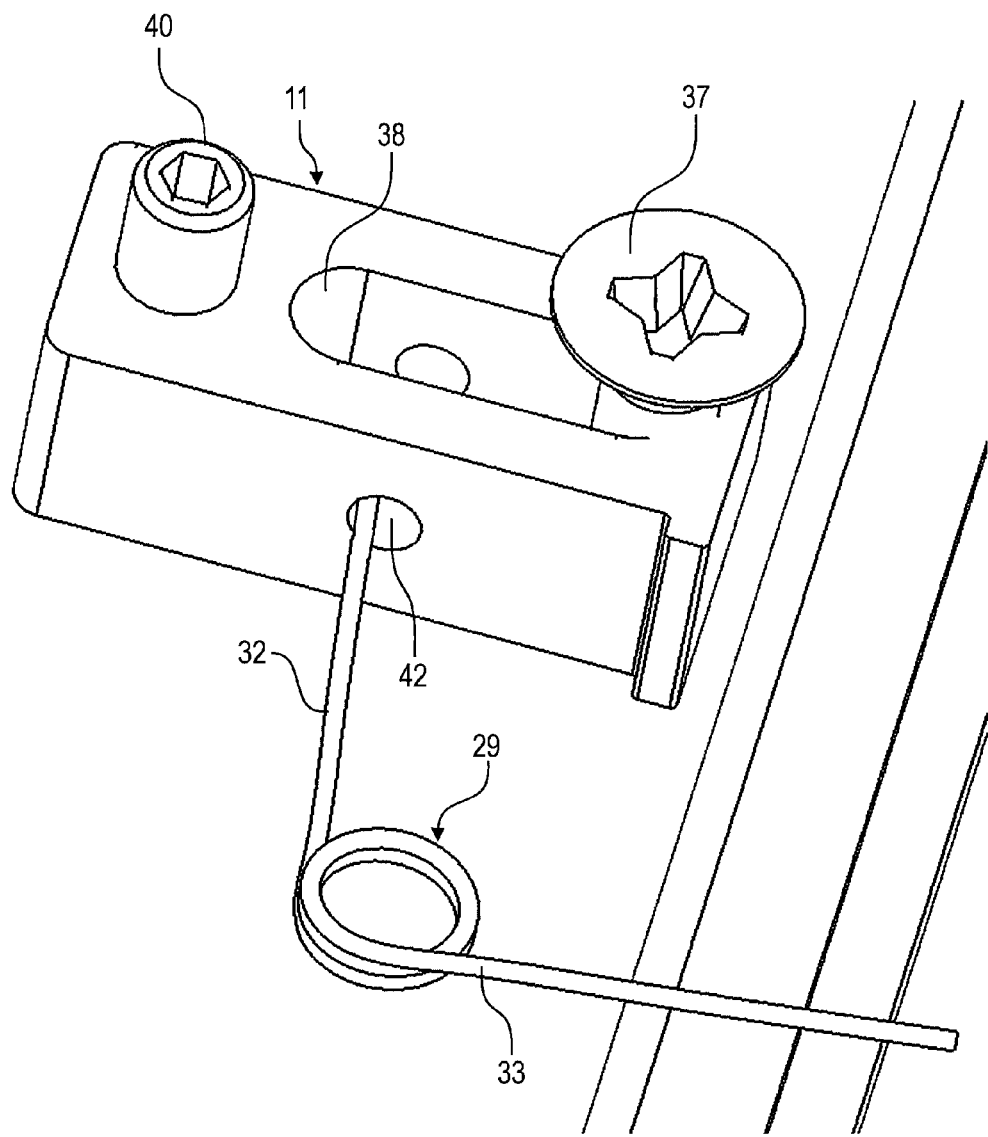
FIG. 9 is a schematic perspective diagram of an implementation manner of an engagement element used in the housing shown in FIG. 4.

As shown in FIG. 9, a drilling hole 42 is laterally provided on the engagement element 11, and the first leg 32 of the spring element 29 allocated to the corresponding engagement element 11 is engaged in the drilling hole.

As shown in FIG. 6, each engagement element 11 further includes lateral protrusions 43 and 44. The protrusions are suitable to limit a movement path of the engagement element 11 in a direction toward the locked position VP. A specific manner lies in that the protrusions abut against position limiting surfaces 45 and 46 (FIG. 8) of the basic section 18 from an inner side. Each first recess 28 is allocated with the two position limiting surfaces 45 and 46.

Figure 10:
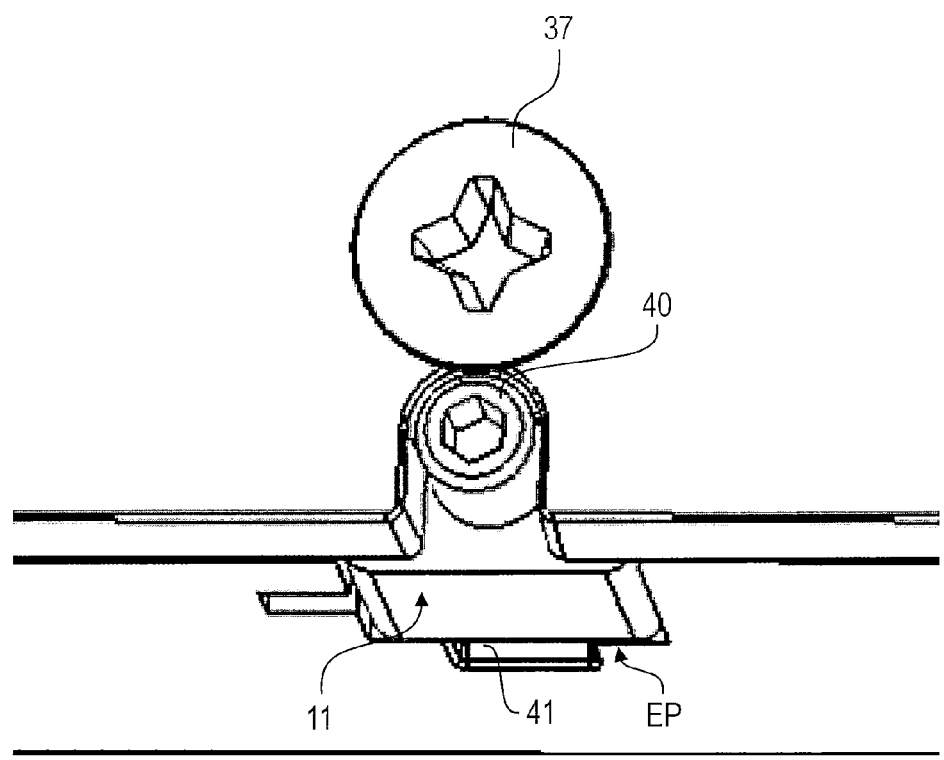
FIG. 10 is another schematic perspective diagram of the engagement element shown in FIG. 9.
Figure 11:
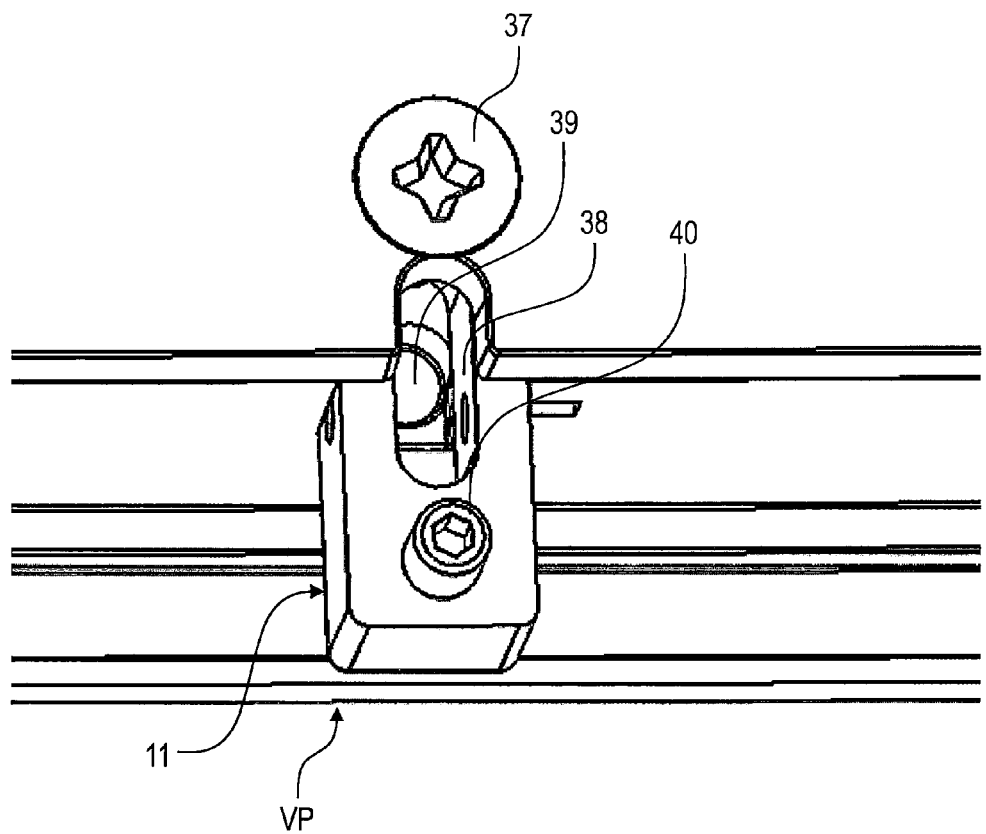
FIG. 11 is another schematic perspective diagram of the engagement element shown in FIG. 9.

FIG. 10 shows the engagement element 11 at the unlocked position EP again. FIG. 11 shows the engagement element 11 shown in FIG. 10 at the locked position VP.

Functions of the housing 10 are briefly summarized again below. As shown in FIG. 1, to install the monitor 9 on the plate 13, all engagement elements 11 are located at the unlocked position EP. The fixing element 40 allocated to each engagement element 11 is screwed into the second drilling hole 39. The basic section 18 of the monitor 9 or the housing apparatus 2 connected to the housing 10 passes through the notch 12 provided in the plate 13. Once the back surface 24 of the frame section 23 is attached on the front surface 14 of the plate 13, the engagement element 11 can be moved from the unlocked position EP to the locked position VP. In this case, the spring element 29 pretensions the engagement element 11 a direction toward the locked position VP.

By loosening the fixing elements 40, the fixing elements are detached from engagement with the second drilling hole 39 and can slide along the guide slot 41. Once the fixing element 40 is released, the engagement element 11 automatically moves from the unlocked position EP to the locked position VP by means of spring pretension. The engagement element 11 is engaged behind the plate 13 or into the slot 16 provided in the plate 13 in a shape fitting manner. At the locked position VP, the fixing element 40 can be optionally screwed into each engagement element 11 again, so as to be tensioned with the plate 13. In this case, the housing 10 is fixedly connected to the plate 13.

To remove the housing 10 from the notch 12 of the plate 13, the fixing element 40 is released, and the engagement element 11 is pressed back into the housing 10 in a direction reverse to the elastic force of the spring element 29. By re-screwing the fixing element 40 into the second drilling hole 39, the engagement element 11 is fixed at the unlocked position EP, and the housing 10 can be extracted from the notch 12. When the engagement elements 11 are moved from the unlocked position EP to the locked position VP, and from the locked position to the unlocked position, the engagement elements implement only linear movement and move in a manner of being parallel to the back surface 24 of the frame section 23.

The engagement element 11 is pre-tensioned by the spring, so that the housing 10 can be simply installed on the plate 13. In addition, the fixing element 40 is not completely unscrewed from the engagement element 11, thereby parts from being lost in the process of installing the housing 10 on the plate 13 is prevented. In this way, the housing 10 can be installed on the plate 13 simply and conveniently.

The present text describes the disclosure with reference to several embodiments, but the disclosure may also use various changed solutions.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A housing (10) used in a monitor (9) of an industrial computer (1), comprising:
   a basic section (18), on which the housing (10) is installed in a plate (13) or on the plate, wherein the basic section is adapted to be accommodated in a notch (12) of the plate (13);
   a frame section (23) connected to the basic section (18), wherein the frame section is adapted to be attached on the plate (13);
   at least one engagement element (11), adapted to optionally move from an unlocked position (EP) where the at least one engagement element (11) is detached from engagement with the plate (13) to a locked position (VP) where the at least one engagement element (11) is engaged with the plate (13) in a shape fitting manner;
   a spring element (29), which pretensions the at least one engagement element (11) in a direction toward the locked position (VP);
   a guide element (37), wherein the at least one engagement element (11) is linearly guided along the guide element; and
   a fixing element (40), configured to fix the at least one engagement element (11) at the unlocked position (EP) or the locked position (VP), wherein the fixing element (40) is releasable, so that the at least one engagement element (11) automatically moves from the unlocked position (EP) to the locked position (VP) by means of the spring element (29).

2. The housing according to claim 1, wherein the at least one engagement element (11) is adapted to move from the unlocked position (EP) to the locked position (VP) in a manner of being parallel to a back surface (24) of the frame section (23).

3. The housing according to claim 1, wherein the at least one engagement element (11) is accommodated in a first recess (28) provided on the basic section (18), and the spring element (29) is accommodated in a second recess (30) provided on the basic section (18).

4. The housing according to claim 3, wherein the first recess (28) is provided with a first drilling hole (36) configured to accommodate the guide element (37) and a second drilling hole (39) configured to accommodate the fixing element (40).

5. The housing according to claim 4, wherein a guide slot (41) configured to guide the fixing element (40) is provided on the second drilling hole (39).

6. The housing according to claim 1, wherein the spring element (29) comprises two legs (32, 33), and one leg (32) of the two legs is connected to the at least one engagement element (11).

7. The housing according to claim 1, wherein the at least one engagement element (11) comprises protrusions (43, 44), and the protrusions are adapted to limit a movement path of the at least one engagement element (11) in the direction toward the locked position (VP).

8. The housing according to claim 1, wherein the at least one engagement element (11) is adapted to move from the locked position (VP) to the unlocked position (EP) in a direction reverse to an elastic force of the spring element (29).

9. The housing according to claim 1, wherein the guide element (37) is connected to the basic section (18), and the guide element (37) is guided in a guide slot (38) provided on the at least one engagement element (11).

10. The housing according to claim 1, wherein the fixing element (40) is releasable by means of rotation thereof.

11. The housing according to claim 1, wherein the fixing element (40) is a threaded pin.

12. The housing according to claim 1, wherein the at least one engagement element (11) is adapted to be engaged in a slot (16) provided on the plate (13) at the locked position (VP) in a shape fitting manner.

13. The housing according to claim 1, wherein a quantity of the at least one engagement element (11) is plurality, and the engagement elements are provided on side walls (19 to 22) of the basic section (18).

14. A monitor (9) used in an industrial computer (1) comprising the housing (10) according to claim 1.

15. An industrial computer (1) comprising the housing (10) and the monitor (9) according to claim 14.

* * * * *